United States Patent [19]

Foucher et al.

[11] Patent Number: 5,163,160
[45] Date of Patent: Nov. 10, 1992

[54] SATELLITE TRANSPONDER ABLE TO USE SAME FREQUENCY SCHEME FOR TRANSMITTER AND RECEIVER LOCAL OSCILLATOR

[75] Inventors: Jean-Luc Foucher, Seysses; Marc Atge, Toulouse; Dominique Rousselet, Toulouse; Emile Tonello, Toulouse; Pascal Triaud, Tournefeuille, all of France

[73] Assignee: Alcatel Espace, Courbevoie, France

[21] Appl. No.: 582,294

[22] Filed: Sep. 14, 1990

[30] Foreign Application Priority Data

Sep. 14, 1989 [FR] France .................. 89 12043

[51] Int. Cl.$^5$ .................. H04B 1/40; H04B 7/185
[52] U.S. Cl. .................. 455/76; 455/13.2; 455/87; 455/208; 455/260; 455/265
[58] Field of Search .................. 455/12, 75, 76, 86, 455/87, 255-260, 264, 265, 315, 316, 343, 182, 183, 20, 22, 23, 192, 208, 13.2

[56] References Cited

U.S. PATENT DOCUMENTS

| | | | |
|---|---|---|---|
| 4,365,349 | 12/1982 | Ogita et al. | 455/192 |
| 4,513,447 | 4/1985 | Carson | 455/76 |
| 4,879,757 | 11/1989 | Loughlin | 455/182 |
| 4,955,075 | 9/1990 | Anderson | 455/182 |
| 5,029,237 | 7/1991 | Ragan | 455/182 |

FOREIGN PATENT DOCUMENTS

| | | |
|---|---|---|
| 0051473 | 5/1982 | European Pat. Off. |
| 0007613 | 1/1977 | Japan . |
| 0184005 | 8/1986 | Japan . |

Primary Examiner—Reinhard J. Eisenzopf
Assistant Examiner—Chi H. Pham
Attorney, Agent, or Firm—Sughrue, Mion, Zinn, Macpeak & Seas

[57] ABSTRACT

A satellite transponder has the local oscillator in the receiver slaved to a quartz crystal oscillator by a narrowband phase-locked loop during a standby period or in the absence of received signal and by a wideband phase-locked loop immediately the signal is received, at which time the narrowband phase-locked loop is switched out automatically.

16 Claims, 2 Drawing Sheets

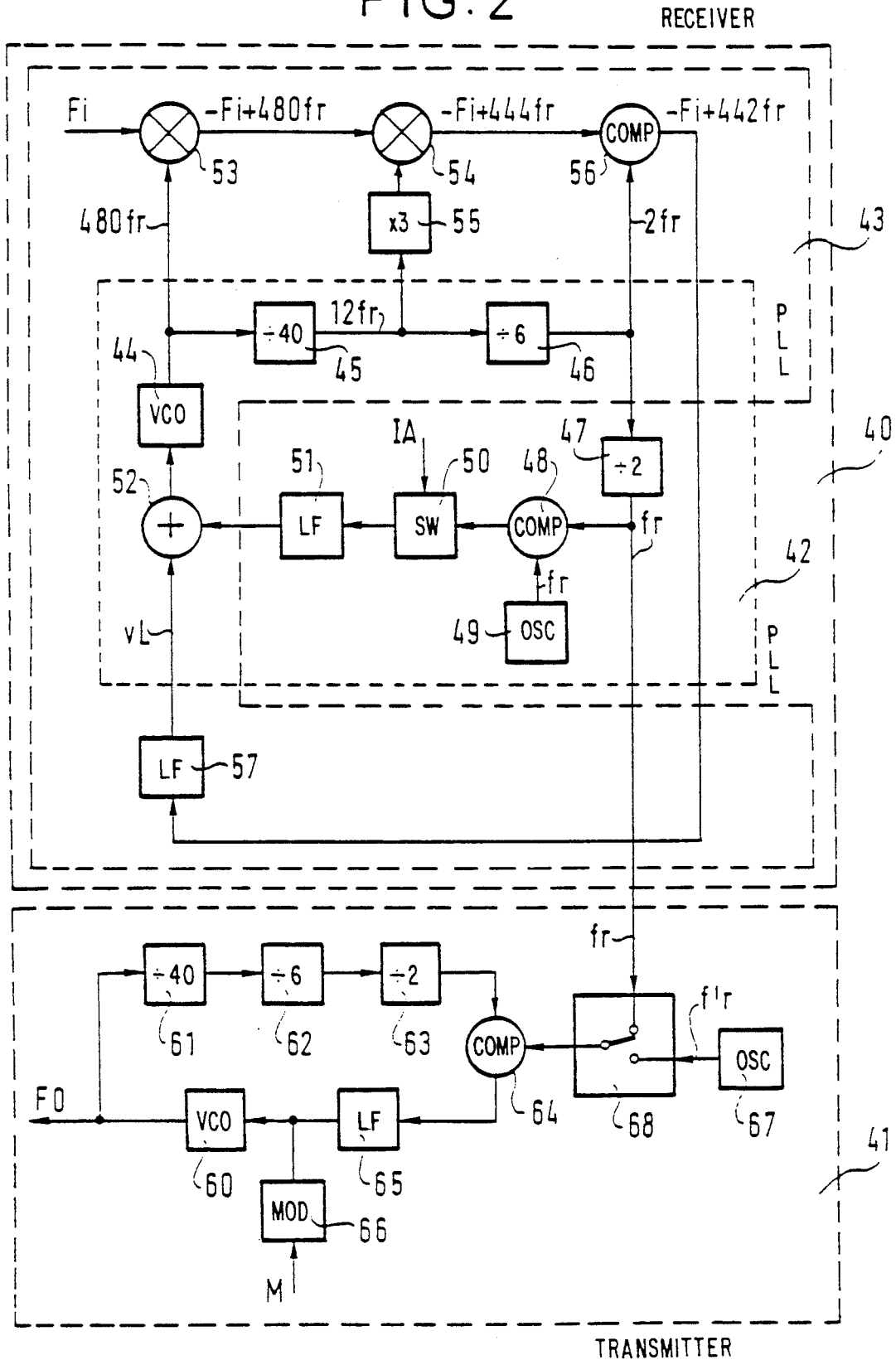

SATELLITE TRANSPONDER ABLE TO USE SAME FREQUENCY SCHEME FOR TRANSMITTER AND RECEIVER LOCAL OSCILLATOR

BACKGROUND OF THE INVENTION

1. Field of the Invention

The invention concerns a satellite transponder and in particular an S band transponder for a "TELECOM II" type satellite.

2. Description of the Prior Art

Operation of a satellite and its payload must be monitored continuously. The telemetry, telecommand and location system enables a control center to implement this function using telemetry information sent down by the satellite; the control center sends up telecommand instructions. The location function provides data identifying the position of the satellite for injection into the final orbit and station-keeping. The system uses either a dedicated frequency band, usually the S band, especially for injection into the final orbit, or a telecommunications band used for the normal function of the satellite.

A prior art transponder is described in "Phaselock Techniques" by Floyd M. GARDNER (John Wiley and Sons; second edition, page 163, FIGS. 8-12).

An object of the invention is to provide a transponder offering improved performance than prior art transponders at reduced cost.

SUMMARY OF THE INVENTION

The invention consists in a satellite transponder wherein a local oscillator of the receiver is slaved to a quartz crystal oscillator by a narrowband phase-locked loop in a standby period or in the absence of received signal and said local oscillator is slaved to the receiver input signal by a wideband phase-locked loop immediately upon receipt of a signal the narrowband phase-locked loop being then switched out automatically.

In this transponder the transmitter is advantageously tuned to the same frequency as the local oscillator of the receiver in coherent mode, being stabilized by a phase-locked loop identical in terms of frequency and components to the narrowband phase-locked loop.

The advantages of a transponder of this kind include:

A reduction in the cost and the manufacturing cycle of the receiver+transmitter equipment.

Improved long-term stability of the receiver standby frequency.

Insensitivity of the receiver to "pushing" phenomena.

Improved stability of the receiver phase-locked loop.

The invention therefore makes it possible:

to use the same frequency scheme for the transmitter and the receiver local oscillator, to use two phase-locked loops in the receiver, under the control of an automatic switching system:

a narrowband phase-locked loop providing long-term stability and eliminating unwanted "pushing" effects during the carrier acquisition phase, a wideband phase-locked loop for locking onto the up-link carrier, used to demodulate the up-link signal.

A lock-on indicator automatically switches out the narrowband loop as soon as the wideband loop is locked onto the up-link carrier and switches it in again if synchronization is lost.

No voltage controlled quartz crystal oscillator is used, in order to avoid any spurious pole in the wideband loop (improving its stability); also, a device of this kind is difficult to implement (involving long lead times) and costly.

Frequency dividers are used rather than frequency multipliers, which are complex modules that are very delicate and have a long manufacturing lead time (and must be followed by severe filtering if the multiplication factor is high).

The characteristics and advantages of the invention will emerge from the following description given by way of non-limiting example with reference to the appended diagrammatic drawings.

BRIEF DESCRIPTION OF THE DRAWINGS

FIG. 2 shows the transponder in accordance with the invention.

DETAILED DESCRIPTION OF THE INVENTION

Figure 1:
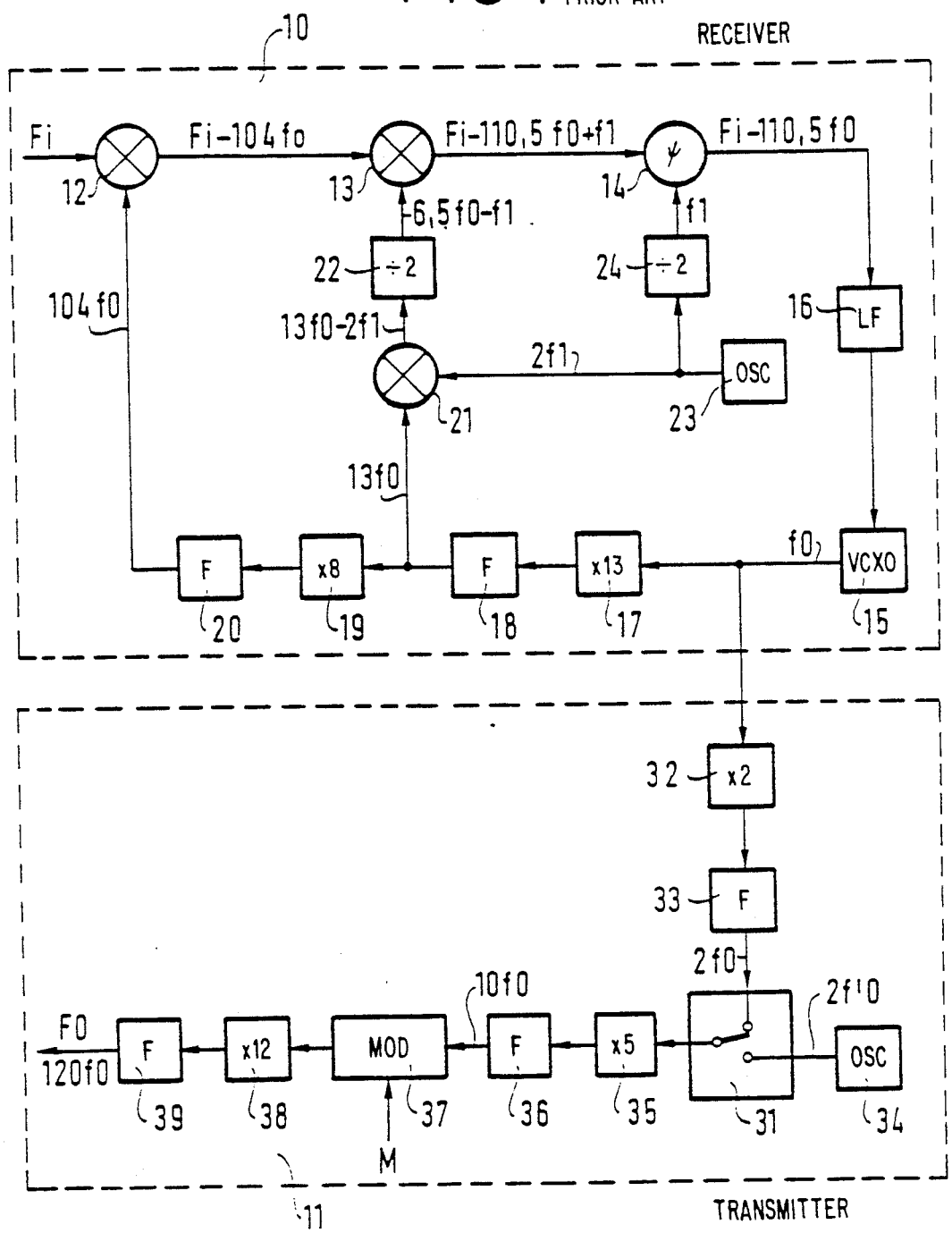
FIG. 1 shows a prior art transponder.

The prior art transponder (source: see preamble to this description) shown in FIG. 1 comprises a receiver 10 and a transmitter 11.

In the remainder of the description the main signals are identified by their frequency value.

In the receiver 10:

a first mixer 12 receives an input frequency Fi and a frequency 104 f0;

a second mixer 13 receives the output signal from the first mixer, that is Fi−104 f0, and a signal 6.5 f0−f1, a phase comparator 14 receives the output signal of the second mixer 13 and a signal f1. The output signal of the comparator controls a voltage-controlled quartz crystal oscillator (VCXO) 15 via a loop filter 16. The oscillator 15 supplies:

the signal 104 f0 to the first mixer 12 via a first multiplier 17 which multiplies by 13 followed by a filter 18 and a second multiplier 19 which multiplies by 8 followed by a filter 20;

the signal 6.5 f0−f1 via the first multiplier 17 and the associated filter 18, a third mixer 21 and a divider 22 which divides by 2; a quartz crystal oscillator 23 supplying a signal 2f1 is directly connected to the third mixer 21 and to the phase comparator 14 via a divider 24 which divides by 2.

In the transmitter 11:

a switch 31 receives:

a coherent channel consisting of the output signal of the VCXO 15 after it has passed through a multiplier 32 which multiplies by 2 and a filter 33;

a non-coherent channel consisting of a signal 2f'0 supplied by a quartz crystal oscillator 34;

the output signal F0 of the transmitter is the output signal of the switch 31 after it has passed through a multiplier 35 which multiplies by 5, a filter 36, a modulator 37 which receives the modulation signal M, a multiplier 38 which multiplies by 12 and a filter 39.

In the block diagram of the receiver 10 the quartz crystal oscillator 23 (frequency 2f1) does not condition the parameters of the phase-locked loop, providing a fixed second intermediate frequency f1 when the receiver 10 is locked on.

The heart of the receiver is the VCXO 15, frequency f0.

When the receiver 10 is locked on, the frequency of the VCXO 15 tracks the input frequency Fi so that 110.5 f0=Fi.

When the receiver 10 is not locked on, the VCXO stabilizes the receiver standby frequency, which is 110.5 f0. This standby frequency is therefore affected by the stability of the control voltage in the absence of any carrier at the input.

Also, this circuit is subject to "pushing": when the carrier frequency is scanned from the ground the receiver locks on when the carrier frequency passes through its standby frequency. Various phenomena can occur during this locking on phase. Under some conditions a voltage may appear when tends to "push" the VCXO frequency away from the carrier frequency (when it should move towards it). The phenomenon may be problematical if the up-link carrier is scanned slowly: the oscillator can go to the limit of its operation and prevent locking on of the receiver.

This circuit uses two frequency multipliers (17 and 19) which are difficult to implement and require severe filtering (18 and 20):

a multiplier by 13: f0→13 f0, a multiplier by 8: 13 f0→104 f0.

The VCXO 15 also raises problems: because of near-frequency spurious responses (anti-resonance of the quartz crystal), the modulation loop must be reduced so as to not to excite them. The effect of this is to introduce an additional spurious pole into the receiver loop.

In the transmitter 11 the quartz oscillator 34, frequency 2f0 is used as a non-coherent mode reference.

Again frequency multipliers (32, 35 and 38) are used which are difficult to implement:

a multiplier by 2 : f0→2 f0, a multiplier by 5 : 2 f0→10 f0, a multiplier by 12 : 10→120 f0.

Modulation is applied to the carrier at 10 f0.

FIG. 2 shows the transponder in accordance with the invention with its receiver part 40 and its transmitter part 41.

The receiver 40 comprises:

a narrowband phase-locked loop 42 which comprises a voltage-controlled oscillator (VCO) 44 supplying a signal at the frequency 480 fr, a divider 45 which divides by 40, a divider 46 which divides by 6, a divider 47 which divides by 2, a phase/frequency comparator 48 receiving the signal from the divider 47 which divides by 2 and a signal fr from a quartz oscillator 49, a switch 50 receiving a command signal IA, a loop filter 51 and an adder 52;

a wideband phase-locked loop 43 which includes various circuits which are also part of the narrowband phase-locked loop 42, namely: the adder 52, the voltage-controlled oscillator 44, the divider 45 which divides by 40 and the divider 46 which divides by 6, together with new circuits, namely: a first mixer 53 which receives the input signal Fi and a signal from the voltage-controlled oscillator 44, followed by a second mixer 54 which receives the signal from the divider 45 which divides by 40 after it has been multiplied by 3 by a multiplier 55, followed by a phase comparator 56 which receives the signal from the divider by 46 which divides by 6 and the output of which is connected to the adder 52 via a loop filter 57.

The signal at the output of the first mixer 53 is: $-Fi+480$ fr; the signal at the output of the second mixer 54 is: $-Fi+444$ fr; the signal at the output of the phase comparator 56 is: $-Fi+442$ fr. The purpose of the wideband loop is to maintain the condition $Fi=442$ fr.

The transmitter 41 comprises the same components as the narrowband phase-locked loop, namely a voltage-controlled oscillator 60, a divider 61 which divides by 40, a divider 62 which divides by 6, a divider 63 which divides by 2, a phase/frequency comparator 64 and a loop filter 65 connected to the oscillator 60.

It further comprises:

a modulator 66 for loop out-band phase modulation, a quartz crystal oscillator 67 and a switch 68 for operation in coherent mode (connected to the receiver 40) or in non-coherent mode (connected to the oscillator 67). Note that the frequency scheme of this transmitter is identical to that of the receiver local oscillator: this reduces the design and implementation costs of both systems (identical components, similar adjustments).

In this block diagram, when the receiver 40 is not locked, on the narrowband loop 42 is in service and slaves the voltage-controlled oscillator 44 to the very stable quartz oscillator 49.

The loop 42 compensates any variations in the command voltage vL from the wideband loop 43. The standby frequency of the receiver 40 is therefore very stable.

During the receiver 40 locking on phase the loop 42 compensates the effects of any "pushing" that would otherwise push the frequency of the oscillator 44 away from lock-on rather than moving it towards the latter.

The wideband loop 43 enables the receiver 40 to be locked onto the up-link frequency Fi and delivers a lock-on indicator (IA) so that the switch 50 automatically switches out the narrowband loop 42.

Note that the frequency multipliers 17 and 19 (which respectively multiply by 13 and 8) in the FIG. 1 block diagram have been replaced by dividers 45 and 46 (respectively dividing by 40 and 6), of the ECL type, for example.

The multiplier 55 which multiplies by 3 is in reality part of the mixer 54 (harmonic mixer).

The VCXO 15 from FIG. 1 has been replaced by a VCO 44, frequency 480 fr, and a quartz oscillator 49, frequency fr. These two modules are much simpler, taken separately.

The receiver 40 in accordance with the invention shown in FIG. 2 is of the "long-loop" kind as it uses two intermediate frequencies in the loop.

With no carrier at the input, the receiver 40 is "on standby". Its standby frequency corresponds to the frequency that would have to be applied to the input for it to lock on instantaneously.

The receiver 40 supplies a lock-on indicator IA. This information is sent to the control center on earth so that the center can control the transmitter 41.

It is possible to phase modulate the transmitter carrier. There are two operating modes:

Coherent mode:

$F0 = Fi.240/221$

F0 : transmit frequency.

Fi : receive frequency.

The transmitter therefore uses the reference from the receiver at frequency $Fr = k.Fi/221$.

Non-coherent mode:

The transmitter quartz oscillator 67 is the reference.

In one embodiment the following values were obtained:

Receiver:

$fr = Fi/442$ $Fi \approx 2$ GHz $fr \approx 4.5$ MHz

Narrowband loop : noise band : $2B_n = 20$ Hz
Wideband loop : noise band : $2B_w = 800$ Hz
fr (VCO 44 standby frequency): 480 fr=2.17 GHz
Transmitter:
f0≃2.17 GHz
f'r≃4.5 MHz
Modulation loop : noise band : $2B \simeq 1\,000$ Hz The present invention has been described and shown by way of preferred example only and its component parts may be replaced with equivalent parts without departing from the scope of the invention.

There is claimed:

1. A satellite transponder comprising:
a receiver, coupled to receive an input signal, and comprising a first narrowband phase-locked loop having a local oscillator, a first quartz crystal oscillator for generating a reference frequency signal, and a first switching means coupled to receive the generated reference frequency signal, said first narrowband phase-locked loop being operable, during a standby period in which said receiver does not receive the input signal, for causing said local oscillator to be controlled in accordance with the reference frequency signal generated from said first quartz crystal oscillator, said receiver further comprising a wideband phase-locked loop operable, during a receiving period in which said receiver receives the input signal, for causing said local oscillator to be controlled in accordance with the received input signal, said first switching means operable, during the receiving period, for preventing said local oscillator from receiving the generated reference signal; and
a transmitter comprising a second narrowband phased-locked loop and being operable in a coherent mode and in a non-coherent mode, said transmitter being tuned to said local oscillator's frequency during the transmitter's coherent mode, said transmitter further comprising a second quartz crystal oscillator for generating a reference frequency signal, and second switching means having its output coupled to said second narrowband phase-locked loop, and having its input selectively coupled between an output of said first narrowband phase-locked loop and an output of said second quartz crystal oscillator, said second switching means supplying the output of said first narrowband phase-locked loop to said second narrowband phase-locked loop during said transmitter's coherent mode, and supplying the generated reference frequency signal from said second quartz crystal oscillator to said second narrowband phase-locked loop during said transmitter's non-coherent mode.

2. The satellite transponder as defined in claim 1, wherein said first narrowband phase-locked loop further comprises a divider circuit coupled to receive an output of said local oscillator, and a frequency comparator circuit, coupled to receive an output of said divider circuit and to receive the reference signal generated by said first quartz crystal oscillator for comparing the output of said divider circuit with the reference frequency signal generated by said first quartz crystal oscillator.

3. The satellite transponder as defined in claim 1, wherein said second narrowband phase-locked loop further comprises a divider circuit and a frequency comparator circuit for comparing, during the transmitter's non-coherent mode, an output of said divider circuit with the reference frequency signal generated by said second quartz crystal oscillator.

4. The satellite transponder as defined in claim 1, wherein said wideband phase-locked loop further comprises a first mixer circuit coupled to receive the input signal.

5. The satellite transponder as defined in claim 4, wherein said wideband phase-locked loop further comprises a multiplier circuit and a second mixer circuit for receiving an output of said multiplier circuit and an output of said first mixer circuit.

6. The satellite transponder as defined in claim 5, wherein said multiplier circuit is a multiply-by-3 circuit.

7. The satellite transponder as defined in claim 1, wherein said first narrowband phase-locked loop further includes a first divider circuit coupled to receive an output of said local oscillator, a second divider circuit coupled to receive an output of said first divider circuit, a third divider circuit coupled to receive an output of said second divider circuit, a first phase/frequency comparator for comparing the reference frequency signal generated by said first quartz crystal oscillator with an output of said third divider circuit, a first filter coupled to receive an output of said first switching means, and a first adder circuit coupled between an input of said local oscillator and an output of said filter, and wherein said first switching means is coupled to receive an output of said phase/frequency comparator.

8. The satellite transponder as defined in claim 7, wherein said local oscillator outputs a signal equal to 480fr, and wherein fr is the output of said first quartz crystal oscillator.

9. The satellite transponder as defined in claim 8, wherein said first divider circuit is a divide-by-40 circuit, said second divider circuit is a divide-by-6 circuit, and said third divider circuit is a divide-by-2 circuit.

10. The satellite transponder as defined in claim 1, wherein said wideband phase-locked loop comprises a first mixer circuit for receiving the input signal, a multiplier circuit, a second mixer circuit for receiving an output of said first mixer circuit and an output of said multiplier circuit, a phase comparator circuit coupled to receive an output of said second mixer circuit, a filter coupled to receive an output of said phase comparator circuit, an adder circuit coupled to receive an output of said filter circuit, a first divider circuit coupled to receive an output of said local oscillator, and a second divider circuit coupled between an output of said first divider circuit and an input of said phase comparator, and wherein said local oscillator is coupled to receive an output of said adder circuit.

11. The satellite transponder as defined in claim 10, wherein said first divider circuit is a divide-by-40 circuit, said second divider circuit is a divide-by-6 circuit, and said multiplier circuit provides an output which is three-times its input.

12. The satellite transponder as defined in claim 1, wherein said second narrowband phase-locked loop further comprises a first divider circuit, a second divider circuit coupled to receive an output of said first divider circuit, a third divider circuit coupled to receive an output of said second divider circuit, a phase/frequency comparator coupled to receive an output of said third divider circuit and an output of said second switching means, a filter coupled to receive an output of said phase/frequency comparator, a modulator circuit, a voltage-controlled oscillator coupled to receive an output of said filter and an output of said modulator circuit, said first divider circuit is coupled to receive an output of said voltage-controlled oscillator, and wherein the output of said voltage-controlled oscillator is provided as an output of said transmitter.

13. The satellite transponder as defined in claim 12, wherein said first divider circuit is a divide-by-40 circuit, said second divider circuit is a divide-by-6 circuit and said third divider circuit is a divide-by-2 circuit.

14. The satellite transponder as defined in claim 1, wherein said second narrowband phase-locked loop further comprises a fourth divider circuit, a fifth divider circuit coupled to receive an output of said fourth divider circuit, a sixth divider circuit coupled to receive an output of said fifth divider circuit, a second phase/frequency comparator coupled to receive an output of said sixth divider circuit and an output of said second switching means, a second filter coupled to receive an output of said second phase/frequency comparator, a modulator circuit, a voltage-controlled oscillator coupled to receive an output of said second filter and an output of said modulator circuit, said fourth divider circuit is coupled to receive an output of said voltage-controlled oscillator, and wherein the output of said voltage-controlled oscillator is provided as an output of said transmitter.

15. The satellite transponder as defined in claim 14, wherein said first and third divider circuits are each divide-by-40 circuits, said second and fourth divider circuits are each divide-by-6 circuits, said third and sixth divider circuits are each divide-by-2 circuits, said first and second filters are identical to each other, said first and second phase/frequency comparators are identical to each other, and wherein said local oscillator is a voltage-controlled oscillator.

16. The satellite transponder as defined in claim 1, wherein said transponder is an S-band transponder.

* * * * *